US006930882B2

(12) United States Patent
Broder et al.

(10) Patent No.: US 6,930,882 B2
(45) Date of Patent: Aug. 16, 2005

(54) PROCESSOR SHROUD ADAPTOR FOR MULTIPLE CPU LOCATIONS

(75) Inventors: Damon W. Broder, Austin, TX (US); James Don Curlee, Round Rock, TX (US); Richard L. Eddings, II, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 149 days.

(21) Appl. No.: 10/408,690

(22) Filed: Apr. 7, 2003

(65) Prior Publication Data

US 2004/0196629 A1 Oct. 7, 2004

(51) Int. Cl.[7] .................................................. H05K 7/20

(52) U.S. Cl. ....................... 361/695; 361/687; 361/688; 165/104.33; 454/184

(58) Field of Search ................................ 361/683, 687, 361/692–697, 701, 704, 707–712, 717–719, 721–727; 174/15.1, 163; 165/80.2, 80.3, 80.4, 185, 104.133, 104.134, 121–126; 454/184; 257/717–726; 29/832, 841, 854; 62/259.2; 415/177, 178, 213.1, 214.1

(56) References Cited

U.S. PATENT DOCUMENTS 4,748,540 A 5/1988 Henneberg et al.
5,526,228 A 6/1996 Dickson et al.
5,734,551 A * 3/1998 Hileman et al. ............ 361/695
5,917,697 A * 6/1999 Wang ......................... 361/695
6,113,485 A * 9/2000 Marquis et al. ............. 454/184
6,256,197 B1 * 7/2001 Galis .......................... 361/687
6,464,578 B1 * 10/2002 Chin et al. .................. 454/184
6,552,898 B1 * 4/2003 Noble ........................ 361/687
6,570,760 B1 * 5/2003 Wang ......................... 361/687
6,587,335 B1 * 7/2003 Nelson et al. .............. 361/687
6,643,131 B1 * 11/2003 Huang ........................ 361/697
6,657,863 B2 * 12/2003 Lee et al. ................... 361/697
6,690,577 B2 * 2/2004 Chen .......................... 361/695
6,719,038 B2 * 4/2004 Bird et al. ................. 165/80.3
6,736,196 B2 * 5/2004 Lai et al. .................... 165/122
6,744,630 B2 * 6/2004 Hutchinson et al. ........ 361/687
2004/0004812 A1 * 1/2004 Curlee et al. ............... 361/687
2004/0095723 A1 * 5/2004 Tsai et al. ................... 361/695
2004/0136159 A1 * 7/2004 Hein .......................... 361/688

* cited by examiner

*Primary Examiner*—Michael Datskovskiy
(74) *Attorney, Agent, or Firm*—Haynes and Boone, LLP

(57) ABSTRACT

A fan, a heat generating component and a shroud are mounted in a computer chassis. The shroud includes an open first end adjacent the fan and an open second end adjacent the heat generating component. An adaptor is flexibly mounted on the second open end of the shroud for movement to multiple positions along a plane perpendicular to the second open end of the shroud.

21 Claims, 5 Drawing Sheets

10 18 14 20 17 16 24 25 29

10
20
18
14
17
16
24
25
29

22
16
28
26
24
25
14
20
29
12

PROCESSOR SHROUD ADAPTOR FOR MULTIPLE CPU LOCATIONS

BACKGROUND

The present disclosure relates generally to information handling systems, and more particularly to a processor shroud adaptor for multiple CPU locations.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Today's high power consumption processors require adequate cooling including thermal shrouds to duct air to and from the processor heatsink. The shrouds are made from rigid plastics and usually couple with a fan. The shroud typically runs from the rear wall of the chassis to the processor heatsink. The shroud is required to fit tightly over and around the heatsink to reduce the amount of bypass air. The tighter the shroud fits around the heatsink the more air is forced over the heatsink improving the cooling efficiency of the thermal solution.

Today's chassis support motherboard designs from numerous technologies. These designs require the processor to be placed in varying locations depending on technology and feature sets. The rigid shroud typically cannot support these varying locations.

One solution has been to provide multiple shrouds that are platform specific. This requires a different shroud set-up for each motherboard design. This approach adds cost and requires specific assembly configuration.

Therefore, what is needed is a shroud which is capable of adapting to various CPU locations within a given range of flexibility.

SUMMARY

One embodiment, accordingly, provides a fan mounted in a computer chassis. A heat generating component and a shroud are also mounted in the chassis. The shroud and the heat generating component are interconnected by an adaptor, movable to multiple positions relative to the positions of the shroud and the component.

A principal advantage of this embodiment is that one adaptable shroud has the flexibility of accommodating multiple motherboard designs.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include is one or more disk drives, one or more network ports for communicating with external devices as well as various input and output (I/O) device, such as a keyboard, a mouse, and a video display. The information handling system may also include one or more buses operable to transmit communications between the various hardware components.

Figure 1A:
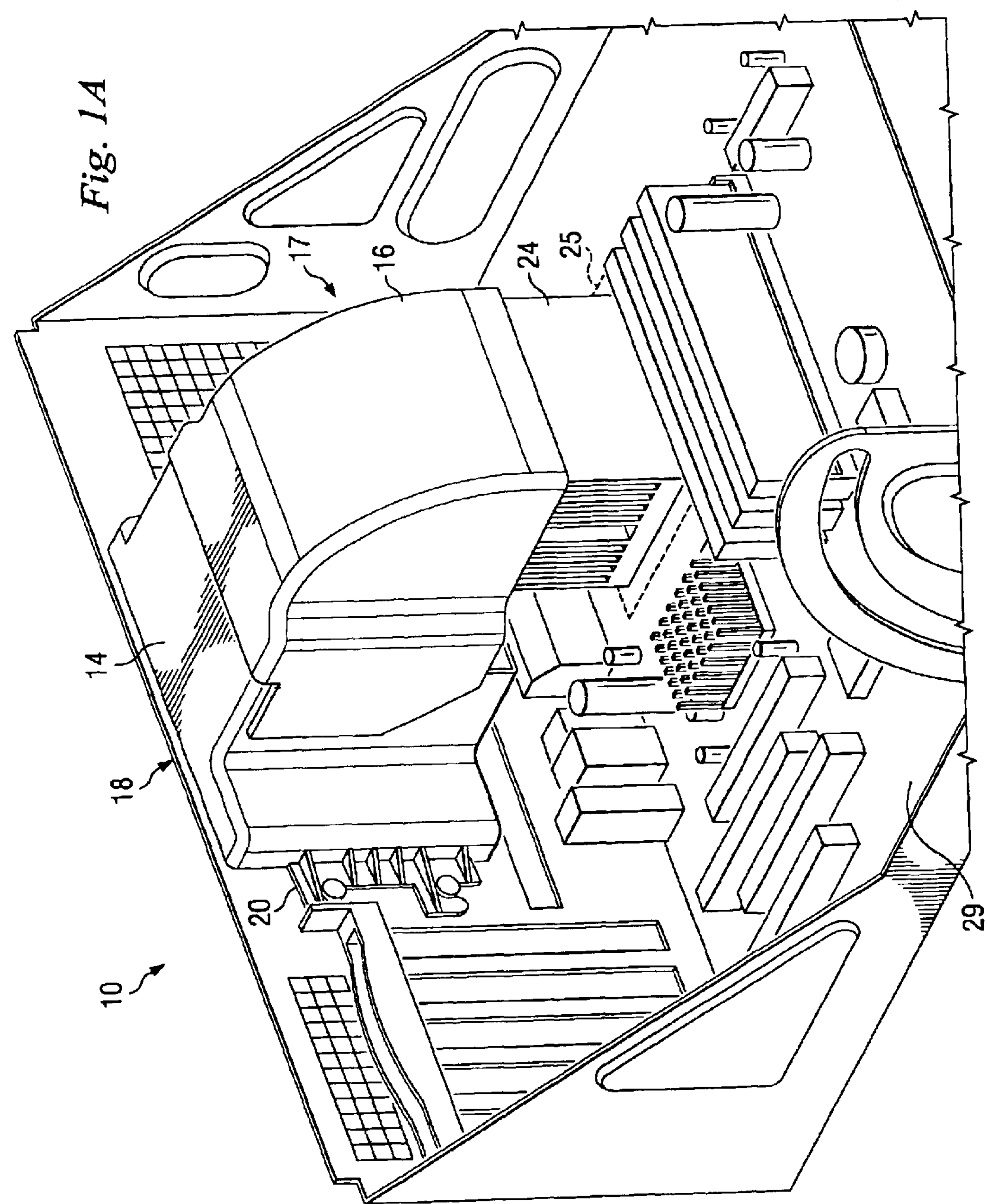
FIG. 1A is an embodiment of a portion of a computer system chassis broken away with a rotating processor shroud in a first position in accordance with teachings of the present disclosure.

Now referring to FIG. 1A, a depiction of a broken away computer system chassis with a rotating processor shroud is shown. A computer system or information handling system is depicted generally at 10 and includes a housing or chassis 12 and a rotating processor shroud. The rotating processor shroud includes fan mount 14 and shroud 16. Shroud 16 may also be referred to as a hood. Chassis 12 includes vent area 18 formed within a side of chassis 12 to permit air to flow from the interior portion of chassis 12 to the exterior portion of chassis 12 or vice versa. In the present embodiment, fan mount 14 is secured to chassis 12 adjacent to vent area 18. Shroud 16 is pivotally and releasable secured to fan mount 14 such that shroud 16 is movable between a first position 17 as shown and a second position 22 as shown in FIG. 1B.

Chassis 12 includes an interior portion wherein information handling system components such as circuit boards, microprocessors and memory components including hard drives, floppy drives, CD drives, sound cards, peripheral components and other components may be installed. Chassis 12 also preferably includes a cover component which is not expressly shown, but when attached to chassis 12 effectively encloses the interior of chassis 12.

Figure 1B:
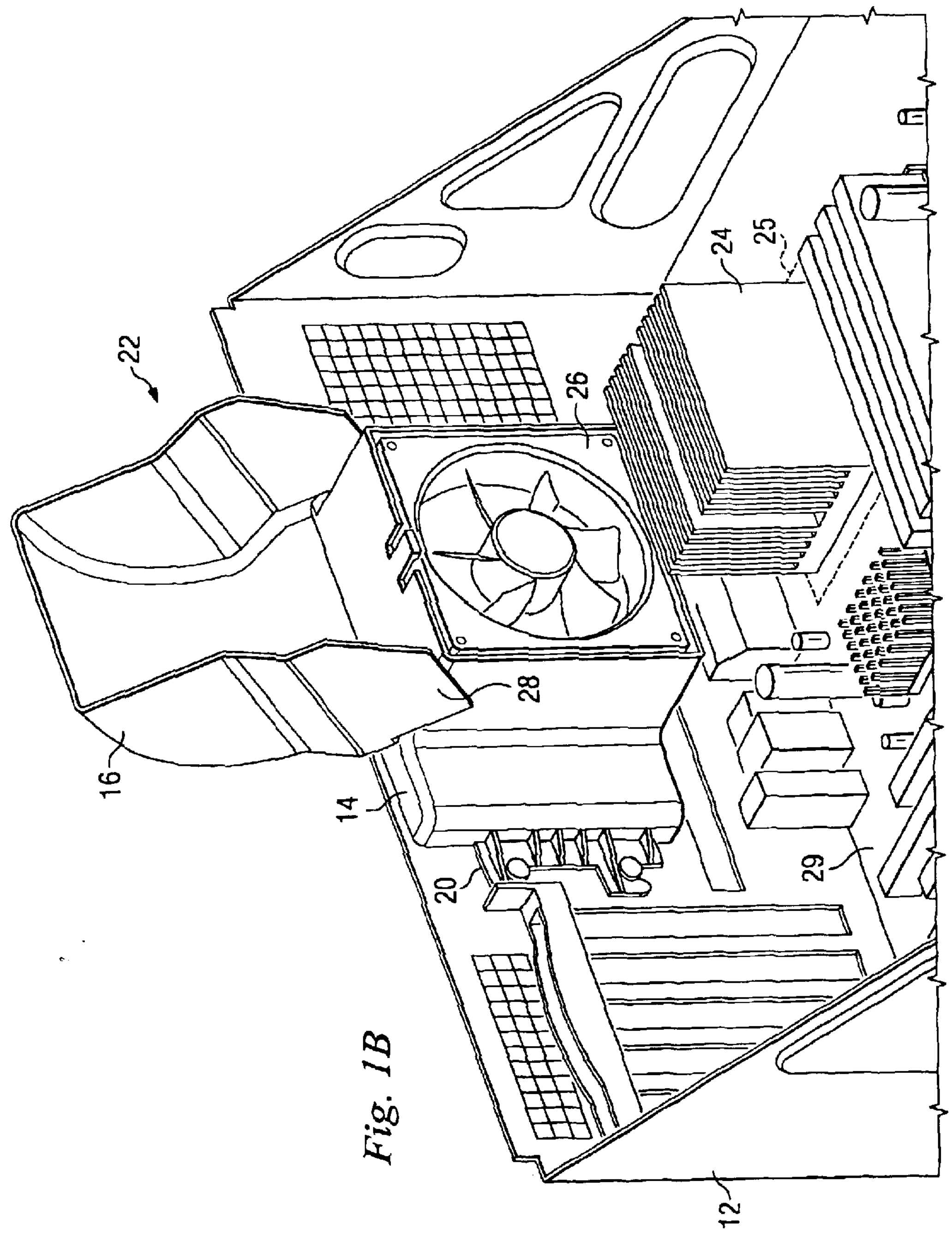
FIG. 1B is an embodiment of a computer system chassis with a rotating processor shroud in a second position.

Now referring to FIG. 1B, a depiction of a computer system chassis with a rotating processor shroud in second position 22 is shown. Second position 22 allows access to the interior of chassis 12. In the present preferred embodiment, second position 22 of shroud 16 provides access to a heat sink 24 seated on a processor portion 25. Accordingly, when shroud 16 is placed in first position 17 as shown in FIG. 1A shroud 16 directs air flow from the heat sink 24 due to air being drawn by a fan 26. The processor portion 25, presently shown with a dashed line, is the area in which microprocessors are attached to a circuit board 29. In an alternative embodiment, the selected processor portion 25 may be in a different position in the interior of the housing, dictated by a change in computer system configuration.

In the present embodiment, fan 26 is disposed within fan mount 14. Fan mount 14 and shroud 16 are connected via shroud interface 28. Shroud interface 28 preferably allows shroud 16 to pivot or rotate with respect to fan mount 14 such that shroud 16 may rotate between first position 17 as shown in FIG. 1A and second position 22.

Figure 1C:
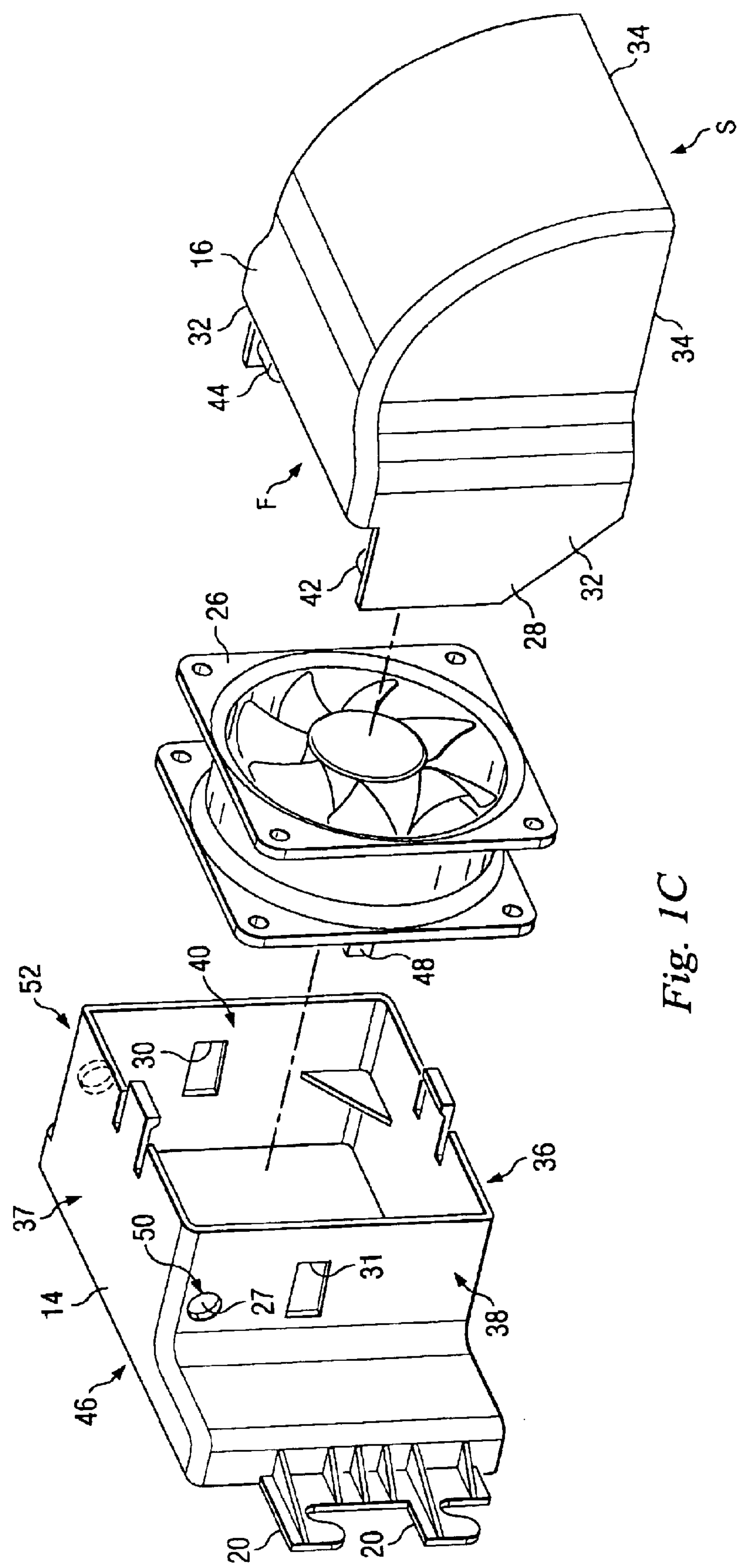
FIG. 1C is an exploded view of an embodiment of a processor shroud assembly including a fan mount, a fan, and a shroud according to teachings of the present disclosure.

Now referring to FIG. 1C, an exploded view of a processor shroud assembly is shown. Fan mount component 14 includes bottom 36 and top 37 which are joined together by first side 38 and second side 40. Fan mount 14 also includes mounting interface 20.

In the present embodiment, mounting interface 20 includes mounting tabs which are preferably formed to interface with portions of chassis 12. In the present preferred embodiment mounting tabs 20 are formed to allow simplified, tool-less attachment to and removal from chassis 12. In an alternative embodiment mounting interface 20 may include any suitable fastener or attachment technique such as using loose fasteners. The present embodiment allows fan mount 14 to be releasably secured adjacent to chassis 12 such that rear opening 46 of fan mount 14 is adjacent to or is abutting vent area 18. Bottom 36, top 37, and sides 38 and 40 are formed to communicate rear opening 46 to front opening 48.

Fan mount 14 also includes fan retainer tab 30. Fan retainer tab 30 facilitates the selectively releasable disposal of fan component 26 within the interior of fan mount 14. Fan 26 is preferably sized to fit within the interior space formed by bottom 36, top 37 and sides 38 and 40. Disposing fan 26, which is typically a relatively heavy component within the system, within fan mount 14, which is a static portion of the shroud assembly, provides for advantageous shock and vibration characteristics.

Fan mount 14 also includes first aperture 50 and second aperture 52 formed within first side 38 and second side 40, respectively. Apertures 50 and 52 are formed to receive pivot nubs 42 and 44 described below. First side 38 and second side 40 also have apertures 31 formed therein. Apertures 31 are formed to interface with a portion of shroud 16 to operatively retain shroud 16 in first position 17. The portion of shroud 16 may be an indentation formed to be received by aperture 31, a tab, or any suitable device for interfacing with aperture 31.

In the present embodiment fan 26 comprises a so-called hot plug redundant fan such as a standard 92 millimeter fan. However, in an alternative embodiment, fan 26 may be any fan component suitable for moving air from the interior of chassis 12 to the exterior of chassis 12 and vice versa.

Shroud component 16 is preferably formed to communicate front opening 48 of fan mount 14 with a desired location within the interior of chassis 12. Shroud 16 includes a first opening F defined by edges 32 and a second opening S defined by edges 34. When shroud 16 is positioned in first position 17 as shown in FIG. 1A, first opening F communicates fan 26 with the second opening S of shroud 16. Shroud 16 further includes first pivot nub 42 and second pivot nub 44 formed to interface with mounting interface 27 of fan mount 14. More specifically, first pivot nub 42 is formed to interface with first aperture 50 of fan mount 14 and second pivot nub 44 is formed to interface with second aperture 52 on fan mount 14. First pivot nub 42 and second pivot nub 44 are preferably formed to allow shroud 16 to pivotally move from first position 17 to second position 22. In an alternative embodiment, shroud 16 and mount 14 may pivotally interface using any suitable means.

Figure 2:
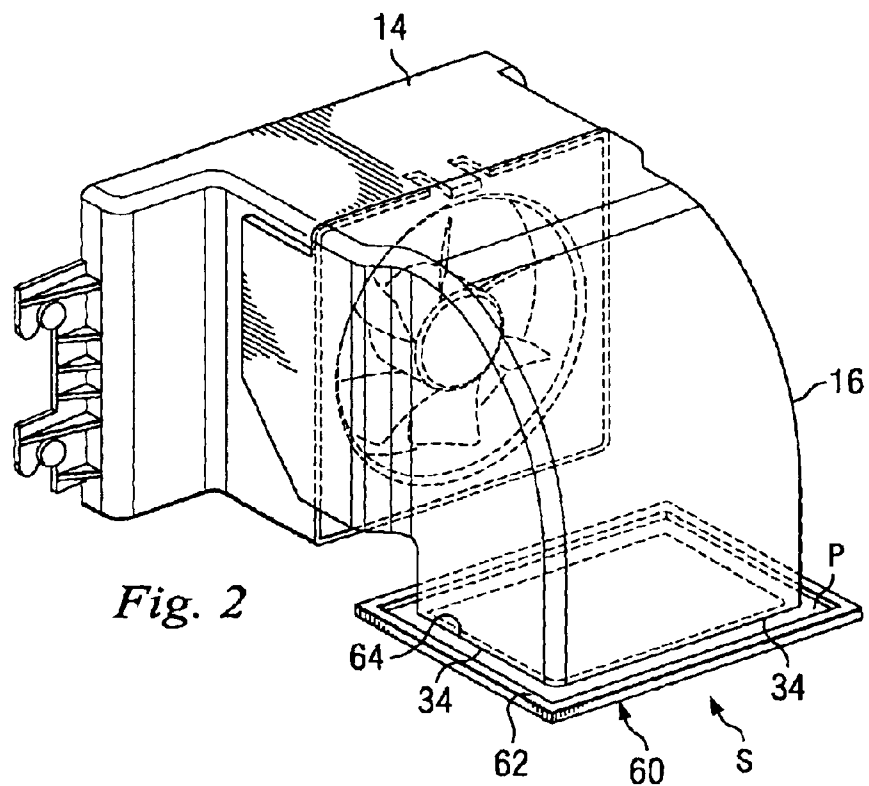
FIG. 2 is a perspective view illustrating an embodiment of the shroud having an adaptor plate.

In one embodiment, shroud 16, FIG. 2, may or may not be pivotally attached to fan hub 14. Regardless, shroud 16 includes an adaptor plate 60 attached to second end S. The adaptor plate 60 has a substantially planar portion P which is perpendicular to second end S. Also, the adaptor plate 60 includes a lip or peripheral guide 62 which extends above the planar portion P and beyond the edges 34 of shroud 16. An opening 64 in adaptor plate 60 permits air to flow through the shroud 16 and adaptor plate 60.

Figure 3:
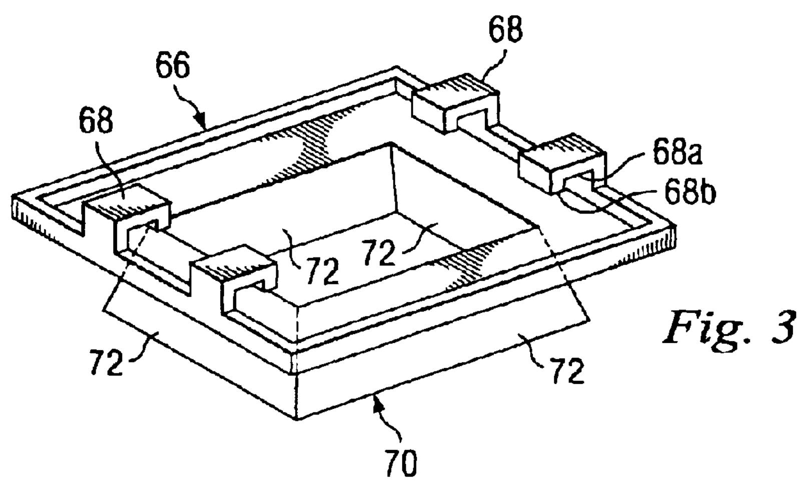
FIG. 3 is a perspective view illustrating an embodiment of an adaptor.

An adaptor 66, FIG. 3, includes a plurality of flexible clips 68 connected to a funnel-like coupling portion 70 which includes a plurality of tapered walls 72. Clips 68 include a cantilever portion 68*a* and a catch portion 68*b* extending from cantilever portion 68*a*.

Figure 4:
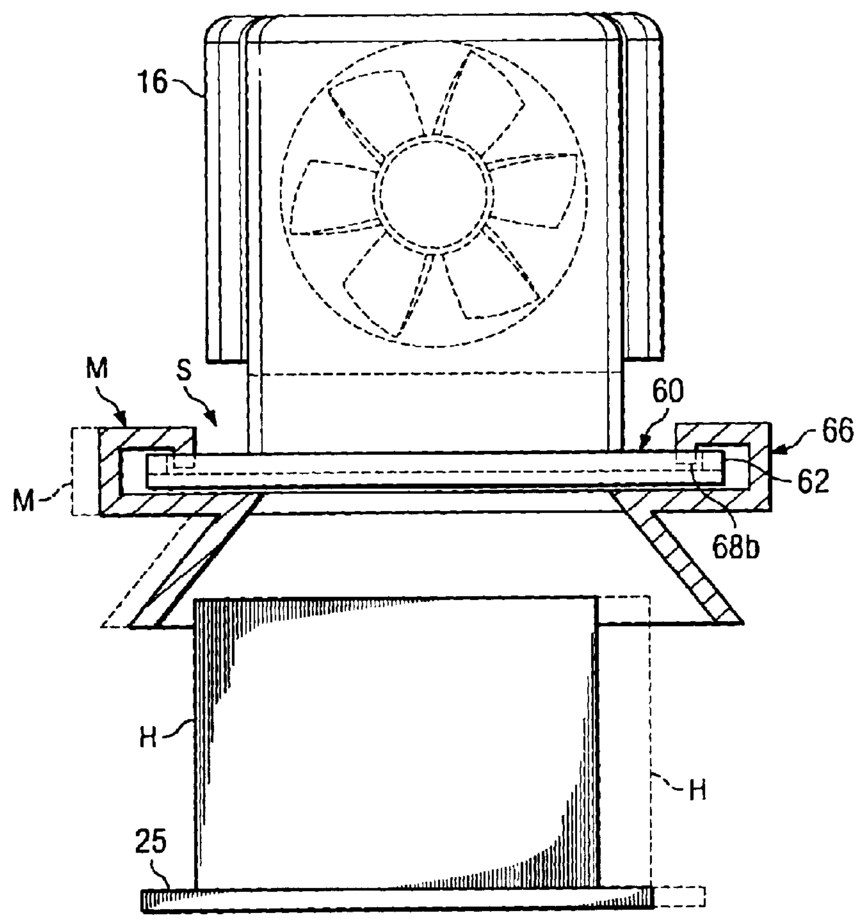
FIG. 4 is a side view illustrating an embodiment of the adaptor movably mounted on the adaptor plate.

With adaptor plate 60 mounted on second end 5 of shroud 16, FIG. 4, adaptor 66 is mounted on adaptor plate 60. Adaptor 66 is movable on plate 60 to multiple positions M as confined by engagement of lip 62 and catch portions 68*b*. Thus, the shroud 16 has a fixed position and heat sink 24 along with processor portion 25 may have a variety of fixed positions H. However, the multi-positionable adaptor 66 can be adjusted to accommodate a range of positions of the heat sink 24.

Figure 5:
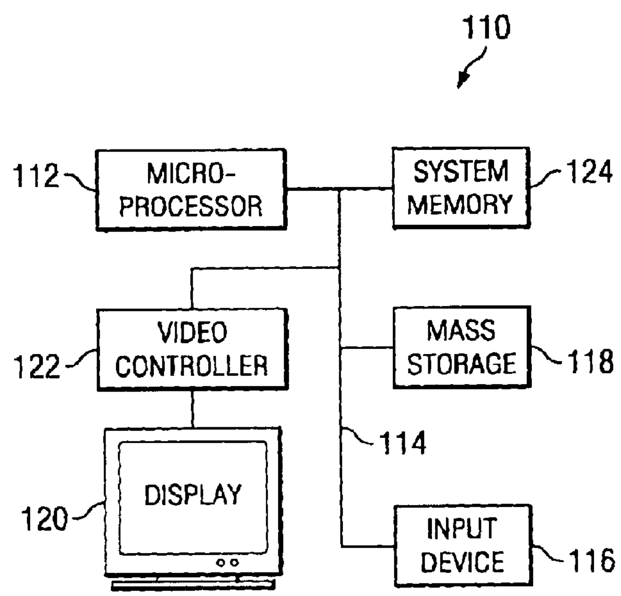
FIG. 5 is a diagrammatic view illustrating an embodiment of a computer system.

In one embodiment, information handling system 110, FIG. 5, includes a microprocessor 112, which is connected to a bus 114. Bus 14 serves as a connection between microprocessor 112 and other components of computer system 110. An input device 116 is coupled to microprocessor 112 to provide input to microprocessor 112. Examples of input devices include keyboards, touchscreens, and pointing devices such as mouses, trackballs and trackpads. Programs and data are stored on a mass storage device 118, which is coupled to microprocessor 112. Mass storage devices include such devices as hard disks, optical disks, magneto-optical drives, floppy drives and the like. Computer system 110 further includes a display 120, which is coupled to microprocessor 112 by a video controller 122. A system memory 124 is coupled to microprocessor 112 to provide the microprocessor with fast storage to facilitate execution of computer programs by microprocessor 112. It should be understood that other busses and intermediate circuits can be deployed between the components described above and microprocessor 112 to facilitate interconnection between the components and the microprocessor.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computer chassis comprising:

a fan mounted in the chassis;

a heat generating component mounted in the chassis;

a shroud mounted in the chassis and having a first open end adjacent the fan and a second open end adjacent the heat generating component;

an adaptor mounted on the second open end of the shroud, the adaptor being movable to multiple positions along a plane perpendicular to the second open end of the shroud; and an adaptor plate attached to the second open end of the shroud.

2. The chassis as defined in claim 1 further comprising:

an adaptor flexibly mounted on the adaptor plate.

3. The chassis as defined in claim 2 wherein the adaptor plate is a planar member including a peripheral guide.

4. The chassis as defined in claim 3 wherein the adaptor includes a plurality of flexible clips for engaging the guide.

5. The chassis as defined in claim 4 wherein the adaptor includes a funnel-like coupling portion.

6. The chassis as defined in claim 1 further comprising:

a funnel-like coupling portion flexibly connected to the adaptor plate.

7. An information handling system comprising:

a chassis;

a microprocessor mounted in the chassis;

a storage coupled to the microprocessor;

a fan mounted in the chassis;

a heat generating component mounted in the chassis;

a shroud mounted in the chassis and having a first open end adjacent the fan and a second open end adjacent the heat generating component;

an adaptor mounted on the second open end of the shroud, the adaptor being movable to multiple positions along a plane perpendicular to the second open end of the shroud; and an adaptor plate attached to the second open end of the shroud.

8. The system as defined in claim 7 further comprising:

an adaptor flexibly mounted on the adaptor plate.

9. The system as defined in claim 8 wherein the adaptor plate is a planar member including a peripheral guide.

10. The system as defined in claim 9 wherein the adaptor includes a plurality of flexible clips for engaging the guide.

11. The system as defined in claim 10 wherein the adaptor includes a funnel-like coupling portion.

12. The system as defined in claim 7 further comprising:

a funnel-like coupling portion flexibly connected to the adaptor plate.

13. A method of providing a shroud adaptable to various chassis configurations comprising:

providing a chassis;

mounting a fan in the chassis;

mounting a heat generating component in the chassis;

mounting a shroud in the chassis, the shroud having a first open end adjacent the fan and a second open end adjacent the heat generating component;

flexibly mounting an adaptor on the second open end of the shroud so that the adaptor is movable to multiple positions along a plane perpendicular to the second open end of the shroud; and attaching an adaptor plate to the second open end of the shroud.

14. The method as defined in claim 13 further comprising:

flexibly mounting an adaptor on the adaptor plate.

15. The method as defined in claim 14 wherein the adaptor plate is a planar member including a peripheral guide.

16. The method as defined in claim 15 wherein the adaptor includes a plurality of flexible clips for engaging the guide.

17. The method as defined in claim 16 wherein the adaptor includes a funnel-like coupling portion.

18. The method as defined in claim 13 further comprising:

flexibly coupling a funnel-like coupling portion to the adaptor plate.

19. The method as defined in claim 13 further comprising:

attaching a fan mount on the chassis; and pivotally attaching the shroud to the fan mount.

20. The method as defined in claim 13 further comprising:

moving the heat generating component relative to the chassis; and moving the adaptor relative to the shroud to accommodate the moved heat generating component.

21. A computer chassis comprising:

a fan and a fan shroud mounted in a first fixed position in the chassis;

a heat generating component mounted in a second fixed position in the chassis;

the shroud having a first open end adjacent the fan and a second open end adjacent the heat generating component;

a multi-positionable adaptor interconnecting the fan shroud and the component, the adaptor being movable to multiple positions relative to the first and the second positions; and an adaptor plate attached to the second open end of the shroud.

* * * * *